US009893159B2

(12) United States Patent
Chang et al.

(10) Patent No.: US 9,893,159 B2
(45) Date of Patent: *Feb. 13, 2018

(54) TRANSISTOR, INTEGRATED CIRCUIT AND METHOD OF FABRICATING THE SAME

(71) Applicant: TAIWAN SEMICONDUCTOR MANUFACTURING CO., LTD., Hsinchu (TW)

(72) Inventors: Chia-Hao Chang, Hsinchu (TW); Ming-Shan Shieh, Hsinchu (TW); Wai-Yi Lien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/582,818

(22) Filed: Dec. 24, 2014

(65) Prior Publication Data

US 2016/0049480 A1 Feb. 18, 2016

Related U.S. Application Data

(63) Continuation-in-part of application No. 14/461,061, filed on Aug. 15, 2014.

(51) Int. Cl.
*H01L 29/417* (2006.01)
*H01L 21/285* (2006.01)
(Continued)

(52) U.S. Cl.
CPC .. *H01L 29/41741* (2013.01); *H01L 21/28518* (2013.01); *H01L 21/28568* (2013.01);
(Continued)

(58) Field of Classification Search
CPC ............... H01L 21/28568; H01L 21/28518
(Continued)

(56) References Cited

U.S. PATENT DOCUMENTS 5,593,924 A * 1/1997 Apte ................. H01L 21/28052
257/E21.165
6,100,179 A * 8/2000 Tran .................. H01L 23/53223
257/E23.16
(Continued)

FOREIGN PATENT DOCUMENTS

JP 2010-258345 A 11/2010
KR 10-2001-0052987 A 6/2001
(Continued)

OTHER PUBLICATIONS

Jiang et al, "Nickel Salicided Source/Drain Extensions forPerformance Improvement in Ultrascaled (Sub 10 nm) Si-Nanowire Transistors" IEEE Electron Device Letters, vol. 30, No. 2, Feb. 2009, pp. 195-197.*

(Continued)

*Primary Examiner* — Jarrett Stark
*Assistant Examiner* — Charles N Ausar-El
(74) *Attorney, Agent, or Firm* — McDermott Will & Emery LLP

(57) ABSTRACT

A transistor, an integrated circuit and a method of fabricating the integrated circuit are provided. In various embodiments, the transistor includes a source electrode, at least one semiconductor channel, a gate electrode, a drain electrode, and a drain pad. The source electrode is disposed in a substrate. The semiconductor channel extends substantially perpendicular to the source electrode. The gate electrode surrounds the semiconductor channel. The drain electrode is disposed on top of the semiconductor channel. The drain pad is disposed on the drain electrode, wherein the drain pad comprises a single implanted silicide layer or a multiple conductive layers with the implanted silicide layer.

20 Claims, 11 Drawing Sheets

(51) Int. Cl.
*H01L 21/8238* (2006.01)
*H01L 23/485* (2006.01)
*H01L 27/092* (2006.01)
*H01L 29/66* (2006.01)
*H01L 29/78* (2006.01)
*H01L 21/768* (2006.01)

(52) U.S. Cl.
CPC ............ *H01L 21/823814* (2013.01); *H01L 21/823885* (2013.01); *H01L 23/485* (2013.01); *H01L 27/092* (2013.01); *H01L 29/66666* (2013.01); *H01L 29/7827* (2013.01); *H01L 21/76834* (2013.01); *H01L 21/76885* (2013.01); *H01L 2924/0002* (2013.01)

(58) Field of Classification Search
USPC ........................................................ 257/555
See application file for complete search history.

(56) References Cited

U.S. PATENT DOCUMENTS

| | | | |
|---|---|---|---|
| 6,444,511 B1 | 9/2002 | Wu et al. | |
| 7,898,041 B2* | 3/2011 | Radosavljevic | H01L 29/41791 257/213 |
| 8,080,456 B2 | 12/2011 | Barwicz et al. | |
| 8,080,458 B2 | 12/2011 | Masuoka et al. | |
| 8,324,940 B2 | 12/2012 | Bangsaruntip et al. | |
| 8,395,218 B2 | 3/2013 | Suk et al. | |
| 8,441,043 B2 | 5/2013 | Bangsaruntip et al. | |
| 8,900,951 B1 | 12/2014 | Cheng et al. | |
| 9,048,301 B2 | 6/2015 | Wang et al. | |
| 9,728,503 B2* | 8/2017 | Peng | H01L 23/53238 |
| 2003/0162357 A1 | 8/2003 | Sugawara et al. | |
| 2004/0021164 A1 | 2/2004 | Kim et al. | |
| 2006/0273389 A1* | 12/2006 | Cohen | B82Y 10/00 257/331 |
| 2007/0001219 A1 | 1/2007 | Radosavljevic et al. | |
| 2010/0270611 A1 | 10/2010 | Masuoka et al. | |
| 2011/0012085 A1* | 1/2011 | Deligianni | B82Y 10/00 257/9 |
| 2011/0291190 A1* | 12/2011 | Xiao | B82Y 10/00 257/347 |
| 2011/0303973 A1* | 12/2011 | Masuoka | H01L 21/26586 257/329 |
| 2011/0303985 A1 | 12/2011 | Masuoka et al. | |
| 2012/0007051 A1 | 1/2012 | Bangsaruntip et al. | |
| 2012/0104516 A1* | 5/2012 | Luoh | H01L 21/28052 257/413 |
| 2012/0161094 A1* | 6/2012 | Huo | H01L 27/249 257/4 |
| 2012/0329217 A1 | 12/2012 | Bangsaruntip et al. | |
| 2013/0105897 A1 | 5/2013 | Bangsaruntip et al. | |
| 2013/0168759 A1* | 7/2013 | Huang | H01L 29/0657 257/329 |
| 2013/0277680 A1 | 10/2013 | Green et al. | |
| 2013/0313524 A1 | 11/2013 | De Micheli et al. | |
| 2013/0328138 A1 | 12/2013 | Masuoka et al. | |
| 2014/0042526 A1 | 2/2014 | Masuoka et al. | |
| 2014/0110755 A1* | 4/2014 | Colinge | H01L 29/41791 257/192 |
| 2014/0162442 A1* | 6/2014 | Khaja | H01L 21/26513 438/529 |
| 2014/0306291 A1* | 10/2014 | Alptekin | H01L 29/41725 257/369 |
| 2015/0017767 A1 | 1/2015 | Masuoka et al. | |
| 2015/0053929 A1* | 2/2015 | Lee | H01L 29/775 257/29 |
| 2015/0171032 A1* | 6/2015 | Colinge | H01L 23/60 257/355 |

FOREIGN PATENT DOCUMENTS

| | | |
|---|---|---|
| KR | 10-2004-0012350 A | 2/2004 |
| KR | 10-2010-0115711 A | 10/2010 |

OTHER PUBLICATIONS

Non-Final Office Action U.S. Appl. No. 14/461,061 dated Sep. 23, 2015.
Xiao Deyuan et al., "A novel GAAC FinFET transistor: device analysis, 3D TCAD simulation, and fabrication", Journal of Semiconductors, Jan. 2009, vol. 30, No. 1, pp. 014001-1-014001-5.
Denyuan Xiao et al., "TCAD study on gate-all-around cylindrical (GAAC) transistor for CMOS scaling to the end of hte roadmap", Microelectronics Journal 40, (2009), pp. 1766-1771.
B. Yang et al., "Vertical Silicon-Nanowire Formation and Gate-All-Around MOSFET", IEEE Electron Device Letters, vol. 29, No. 7, Jul. 2008, pp. 791-794.
Non-Final Office Action U.S. Appl. No. 14/461,061 dated Jun. 23, 2016.

* cited by examiner

TRANSISTOR, INTEGRATED CIRCUIT AND METHOD OF FABRICATING THE SAME

PRIORITY CLAIM AND CROSS-REFERENCE

The present application is a continuation-in-part application of U.S. application Ser. No. 14/461,061 filed on Aug. 15, 2014. The entire disclosures of the above applications are hereby incorporated by reference herein.

BACKGROUND

As the integration degree of integrated circuits increases, many efforts have been made to integrate more devices such as transistors within a limited substrate area. In order to reduce the substrate area occupied by one transistor, various vertical transistor structures with a vertical semiconductor channel provided on a substrate have been proposed.

A nanowire field-effect transistor (FET) is one of these vertical transistor structures. In the nanowire FET, a signal current flows through a plurality of vertical nanowires disposed between a source electrode and a drain electrode of the nanowire FET, and the plurality of vertical nanowires is the vertical semiconductor channel between the source electrode and the drain electrode. The vertical semiconductor channel is controlled by a voltage on a vertical gate electrode, which surrounds each of the plurality of vertical nanowires. Therefore, the nanowire FETs are also called vertical gate-all-around (VGAA) field-effect transistors. Among various proposed vertical transistor structures, the nanowire FETs has attracted much attention, and has been regarded as a highly potential candidate for increasing the integration degree of integrated circuits in following generations.

Therefore, various integrated circuits with the nanowire FETs have been proposed. However, technological advances in structure design of integrated circuits with the nanowire FETs are required to overcome various difficulties because requirements in providing the integrated circuits with advanced performances are becoming more challenging. As such, improvements in integrated circuits and methods of fabricating thereof continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
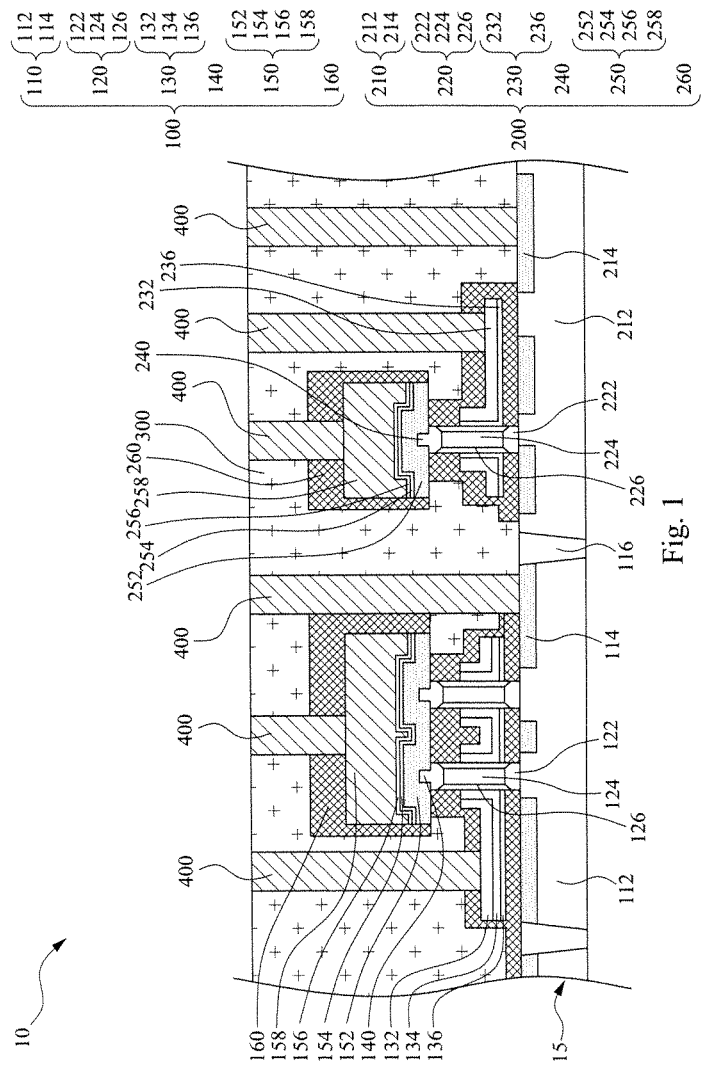
FIG. 1 is a schematic view of at least a portion of an integrated circuit according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

As aforementioned, requirements in integrated circuits with the nanowire FETs are becoming more challenging. For example, resistances of the integrated circuits with the nanowire FETs such as drain side contact resistivity and interconnect sheet resistance are continually required to be improved. In addition, better process flexibility in fabricating the integrated circuits with the nanowire FETs such as control of drain consumption and silicidation during fabricating the nanowire FETs is also crucial to performance of the integrated circuits with the nanowire FETs fabricated. In this regard, a transistor, an integrated circuit and a method of fabricating the integrated circuit are provided according to various embodiments of the present disclosure.

FIG. 1 is a schematic view of at least a portion of an integrated circuit 10 according to various embodiments of the present disclosure. The integrated circuit 10 includes at least one n-type transistor 100, at least one p-type transistor 200, an inter-layer dielectric 300, and a plurality of contact metals 400. The n-type transistor 100 is disposed on a substrate 15. The p-type transistor 200 is disposed on the substrate 15, and the p-type transistor 200 is adjacent to the n-type transistor 100. The n-type transistor 100 and the p-type transistor 200 are vertical metal-oxide-semiconductor field-effect transistors (MOSFET) such as nanowire FETs formed on the substrate 15, and a shallow trench isolation (STI) 116 is disposed between the n-type transistor 100 and the p-type transistor 200 for isolation. The n-type transistor 100 and the p-type transistor 200 respectively includes a source electrode, at least one semiconductor channel, a gate electrode, a drain electrode, and a drain pad. As illustrated in FIG. 1, the n-type transistor 100 includes a source electrode 110, at least one semiconductor channel 120, a gate electrode 130, a drain electrode 140, and a drain pad 150. The source electrode 110 is disposed in the substrate 15. For example, as shown in FIG. 1, the source electrode 110 could include a doped region 112 formed in the substrate 15, and silicides 114 formed on the doped region 112 as ohmic contacts to the doped region 112. Silicides 114 as the ohmic contacts are often formed by depositing transition metals on the doped region 112 formed in the substrate 15, and forming the silicides by annealing. Silicides 114 as the ohmic contacts could also be deposited by direct sputtering of the compound or by ion implantation of the transition metal followed by annealing.

The semiconductor channel 120 extends substantially perpendicular to the source electrode 110. For example, the semiconductor channel 120 could include an epitaxy 122, a semiconductor pillar 124, and an isolation layer 126 as shown in FIG. 1. The epitaxy 122 is formed on the doped region 112. The semiconductor pillar 124 is formed on the epitaxy 122, and surrounded by the isolation layer 126. The gate electrode 130 surrounds the semiconductor channel 120. For example, the gate electrode 130 could include a first metal gate 132, a second metal gate 134, and a gate dielectric layer 136 as shown in FIG. 1. The semiconductor channel 120 is surrounded by the gate dielectric layer 136. The gate dielectric layer 136 is surrounded by the second metal gate 134. Examples of suitable materials for use in the gate dielectric layer 136 include but are not limited to thermally grown silicon dioxide ($SiO_2$), deposited $SiO_2$, or a high-k dielectric such as hafnium oxide ($HfO_2$) deposited by sputter deposition or atomic layer deposition. As used herein, the term "high-k dielectric" refers to dielectrics having a dielectric constant, k, greater than about 4.0, which is higher than the k value of $SiO_2$. The gate dielectric layer 290 could also include a high-k dielectric material. The high-k material can be defined as a dielectric material having its dielectric constant greater than about 3.9, that of a thermal silicon oxide. For example, the high-k dielectric material could include hafnium oxide ($HfO_2$), which has a dielectric constant that is in a range from approximately 18 to approximately 40. Alternatively, the high-k material could include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or a combination thereof. The second metal gate 134 is surrounded by the first metal gate 132. The drain electrode 140 is disposed on top of the semiconductor channel 120. For example, the drain electrode 140 could be an epitaxy formed on top of the semiconductor channel 120.

The drain pad 150 is disposed on the drain electrode 140. As illustrated in FIG. 1, the drain pad 150 collects the drain electrodes 140 corresponding to the semiconductor channels 120, and the drain pad 150 could be electrically connected by one of the contact metal 400. The drain pad 150 includes an implanted silicide layer 152. In various embodiments, the implanted silicide layer 152 of the drain pad 150 is a silicide layer in which a IIIA- or VA-element, for example, boron (B), phosphorous (P) or arsenic (As), is implanted. In some embodiments, the implanted silicide layer 152 includes nickel silicide (NiSi) or nickel platinum silicide (NiPtSi) implanted with a dopant of B, P or As. In various embodiments, the drain pad 150 includes not a single silicide film, but the multiple conductive layers as also illustrated in FIG. 1. Therefore, drain side contact resistivity and interconnect sheet resistance corresponding to the n-type transistor 100 could be significantly reduced by selecting proper materials and suitable thicknesses of the materials in the multiple conductive layers. As illustrated in FIG. 1, in various embodiments of the present disclosure, the drain pad 150 includes an implanted silicide layer 152, a capping layer 156, and a contact metal layer 158. The implanted silicide layer 152 is in direct contact with the drain electrode 140. The capping layer 156 is disposed on the implanted silicide layer 152. The contact metal layer 158 is disposed on the capping layer 156. In various embodiments, the implanted silicide layer 152 could be formed by depositing an amorphous silicon (a-Si) layer and transition metals thereon, annealing the transition metals to convert the a-Si into a silicide layer, and implanting the silicide layer with the dopants such as boron (B), phosphorous (P), or arsenic (As). In addition, the silicide layer could also be deposited by direct sputtering of the compound or by direct sputtering of the transition metal followed by annealing. In various embodiments of the present disclosure, the implanted silicide layer 152 includes implanted titanium silicide (TiSi), nickel silicide (NiSi), cobalt silicide (CoSi), nickel platinum silicide (NiPtSi) or a combination thereof. For example, the NiSi or NiPtSi silicide layer is implanted by drive-in annealing a dopant of B, P or As. The silicide layer that features the implanted dopant through a thermal treatment e.g., the drive-in annealing improves the conductivity of the drain pad 150. The capping layer 156 disposed on the implanted silicide layer 152 could protects the implanted silicide layer 152 and also could be regarded as a glue layer to combine the implanted silicide layer 152 and the contact metal layer 158. The capping layer 156 could be any suitable conductive material. In various embodiments of the present disclosure, the capping layer 156 includes titanium nitride (TiN), tantalum nitride (TaN), or a combination thereof. The contact metal layer 158 is a metal layer, and therefore has lower resistance than that of the implanted silicide layer 152. In various embodiments of the present disclosure, the contact metal layer 158 includes tungsten (W), aluminum (Al), cobalt (Co), or a combination thereof. As aforementioned, in some embodiments the drain pad 150 is not a simple substance such as a single implanted silicide layer including nickel silicide (NiSi) film, but the multiple conductive layers. Accordingly, drain side contact resistivity and interconnect sheet resistance corresponding to the n-type transistor 100 could be further reduced by introducing the contact metal layer 158 which has lower resistance than that of the implanted silicide layer 152. Besides, in various embodiments of the present disclosure, the drain pad 150 further includes a metal layer 154 disposed between the implanted silicide layer 152 and the capping layer 156. The metal layer 154 could be any suitable metal material. In various embodiments of the present disclosure, the metal layer 154 includes titanium (Ti), nickel (Ni), cobalt (Co), or a combination thereof. As illustrated in FIG. 1, in various embodiments of the present disclosure, the n-type transistor 100 further includes a passivation layer 160. The passivation layer 160 encapsulates the drain pad 150. In various embodiments of the present disclosure, the passivation layer 160 includes silicon nitride. Therefore, the drain pad 150 could be protected during following fabricating processes, and reliability of the n-type transistor 100 could be further improved.

Also as illustrated in FIG. 1, the p-type transistor 200 includes a source electrode 210, at least one semiconductor channel 220, a gate electrode 230, a drain electrode 240, and a drain pad 250. The source electrode 210 is also disposed in the substrate 15. As shown in FIG. 1, the source electrode 210 could include a doped region 212 formed in the substrate 15, and silicides 214 formed on the doped region 212 as ohmic contacts to the doped region 112. Silicides 214 as the ohmic contacts are often formed by depositing transition metals on the doped region 212 formed in the substrate 15, and forming the silicides by annealing. Silicides 214 could also be deposited by direct sputtering of the compound or by ion implantation of the transition metal followed by annealing. The semiconductor channel 220 extends substantially perpendicular to the source electrode 210. For example, the semiconductor channel 220 could include an epitaxy 222, a semiconductor pillar 224, and an isolation layer 226 as shown in FIG. 1. The epitaxy 222 is formed on the doped region 212. The semiconductor pillar 224 is formed on the epitaxy 222, and surrounded by the isolation layer 226. The gate electrode 230 surrounds the semiconductor channel 220. For example, the gate electrode 230 could include a metal gate 232, and a gate dielectric layer 236 as shown in FIG. 1. The semiconductor channel 220 is surrounded by the gate dielectric layer 236. The gate dielectric layer 236 is surrounded by the metal gate 232. The drain electrode 240 is disposed on top of the semiconductor channel 220. For example, the drain electrode 240 could be an epitaxy formed on top of the semiconductor channel 220. The drain pad 250 is disposed on the drain electrode 240. As illustrated in FIG. 1, the drain pad 250 contacts with the drain electrodes 240 corresponding to the semiconductor channels 220, and the drain pad 250 could be electrically connected by one of the contact metal 400. The drain pad 250 includes an implanted silicide layer 252 as a single layer, or the implanted silicide layer 252 in multiple conductive layers as illustrated in FIG. 1. In other words, the drain pad 250 may be a simple substance, for example, a single nickel silicide (NiSi) or nickel platinum silicide (NiPtSi) film, or the multiple conductive layers that includes the implanted silicide layer 252 as illustrated in FIG. 1. Therefore, drain side contact resistivity and interconnect sheet resistance corresponding to the p-type transistor 200 could be reduced by selecting proper materials and suitable thicknesses of the materials in the multiple conductive layers. As illustrated in FIG. 1, in various embodiments of the present disclosure, the drain pad 250 includes the implanted silicide layer 252, a capping layer 256, and a contact metal layer 258. The implanted silicide layer 252 is in direct contact with the drain electrode 240. The capping layer 256 is disposed on the implanted silicide layer 252. The contact metal layer 258 is disposed on the capping layer 256. As aforementioned, the implanted silicide layer 252 could be formed by depositing transition metals, and annealing the transition metals deposited. In addition, the implanted silicide layer 252 could also be deposited by direct sputtering of the compound or by direct sputtering of the transition metal followed by annealing. In various embodiments of the present disclosure, the implanted silicide layer 252 includes titanium silicide (TiSi), nickel silicide (NiSi), cobalt silicide (CoSi), nickel platinum silicide (NiPtSi) or a combination thereof. The capping layer 256 disposed on the implanted silicide layer 252 could protects the implanted silicide layer 252 and also could be regarded as a glue layer to combine the implanted silicide layer 252 and the contact metal layer 256. The capping layer 256 could be any suitable conductive material. In various embodiments of the present disclosure, the capping layer 156 includes titanium nitride (TiN), tantalum nitride (TaN), or a combination thereof. The contact metal layer 258 is a metal layer, and therefore has an even lower resistance than that of the implanted silicide layer 252. In various embodiments of the present disclosure, the contact metal layer 258 includes tungsten (W), aluminum (Al), cobalt (Co), or a combination thereof. As aforementioned, the drain pad 250 may be the multiple conductive layers; therefore, drain side contact resistivity and interconnect sheet resistance corresponding to the p-type transistor 200 could be significantly reduced by introducing the contact metal layer 258. Besides, in various embodiments of the present disclosure, the drain pad 250 further includes a metal layer 254 disposed between the implanted silicide layer 252 and the capping layer 256. The metal layer 254 could be any suitable metal material. In various embodiments of the present disclosure, the metal layer 254 includes titanium (Ti), nickel (Ni), cobalt (Co), platinum (Pt) or a combination thereof. As illustrated in FIG. 1, in various embodiments of the present disclosure, the p-type transistor 200 further includes a passivation layer 260. The passivation layer 260 encapsulates the drain pad 250. In various embodiments of the present disclosure, the passivation layer 260 includes silicon nitride. Therefore, the drain pad 250 could be protected during following fabricating processes, and reliability of the p-type transistor 200 could be further improved.

As illustrated in FIG. 1, the inter-layer dielectric 300 covers the n-type transistor 100, the p-type transistor 200, and the substrate 15. The inter-layer dielectric 300 could be formed by depositing silicon oxide in any suitable depositing processes, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD). The plurality of contact metals 400 is disposed in the inter-layer dielectric 300, and the contact metals 400 are respectively in direct contact with the source electrodes 110, 210, the gate electrodes 130, 230, and the drains pad 150, 250 of the n-type transistor 100 and the p-type transistor 200.

Figure 2:
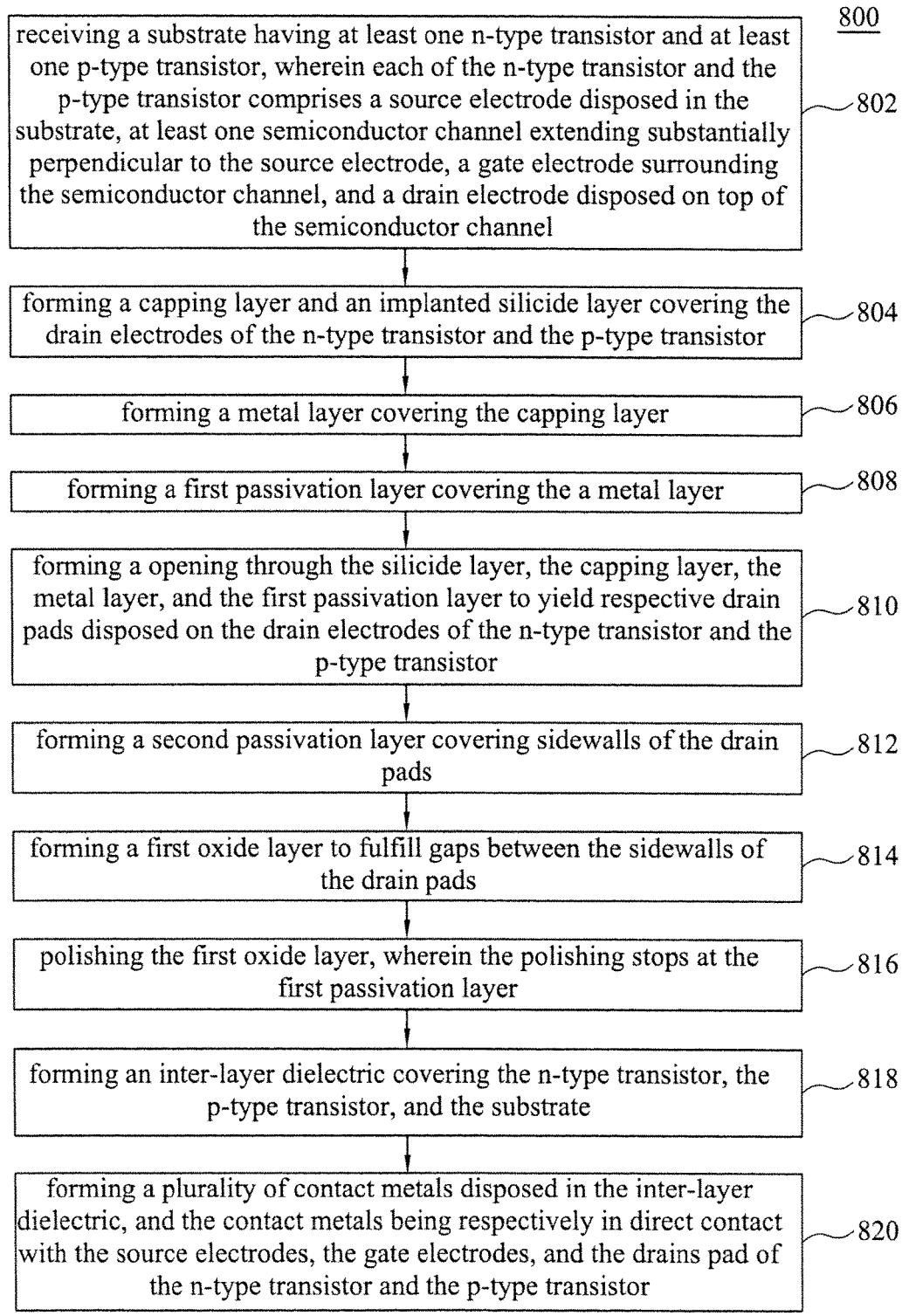
FIG. 2 is a flowchart illustrating a method of fabricating the integrated circuit according to various embodiments of the present disclosure.

FIG. 2 is a flowchart illustrating a method 800 of fabricating the integrated circuit according to various embodiments of the present disclosure. The method 800 begins with block 802 in which a substrate is received. The substrate could be a semiconductor substrate including single crystalline silicon that has been slightly doped with n-type or p-type dopants. The substrate has at least one n-type transistor and at least one p-type transistor. The n-type transistor and the p-type transistor respectively includes a source electrode disposed in the substrate, at least one semiconductor channel extending substantially perpendicular to the source electrode, a gate electrode surrounding the semiconductor channel, and a drain electrode disposed on top of the semiconductor channel. The method 800 continues with block 804 in which an implanted silicide layer and a capping layer and are formed. The implanted silicide layer is formed by implanting a silicide layer that is formed first from an a-Si layer. In some embodiments, all or a part of the a-Si layer is converted into the silicide layer. The implantation is then conducted by a thermal treatment such as a drive-in annealing process under a low temperature, like 400-600° C. The implanted silicide layer covers the drain electrodes of the n-type transistor and the p-type transistor. The capping layer is formed on the implanted silicide layer. The method 800 continues with block 806 in which a metal layer is formed. The metal layer covers the capping layer. The method 800 continues with block 808 in which a first passivation layer is formed. The first passivation layer covers the metal layer. The method 800 further includes forming a opening through the implanted silicide layer, the capping layer, the metal layer, and the first passivation layer to yield respective drain pads disposed on the drain electrodes of the n-type transistor and the p-type transistor as shown in block 810. The method 800 further includes forming a second passivation layer covering sidewalls of the drain pads as shown in block 812. The method 800 further includes forming an first oxide layer to fulfill gaps between the sidewalls of the drain pads and cover the first passivation layer as shown in block 814. The method 800 continues with block 816 in which the first oxide layer is polished. The polishing stops at the first passivation layer. The method 800 continues with block 818 in which an inter-layer dielectric is formed. The inter-layer dielectric covers the n-type transistor, the p-type transistor, and the substrate. The method 800 further includes forming a plurality of contact metals disposed in the inter-layer dielectric, and the contact metals being respectively in direct contact with the source electrodes, the gate electrodes, and the drains pad of the n-type transistor and the p-type transistor as shown in block 820. The details of the methods 800 are further illustrated in FIGS. 3-13 and described in following paragraphs.

Figure 3:
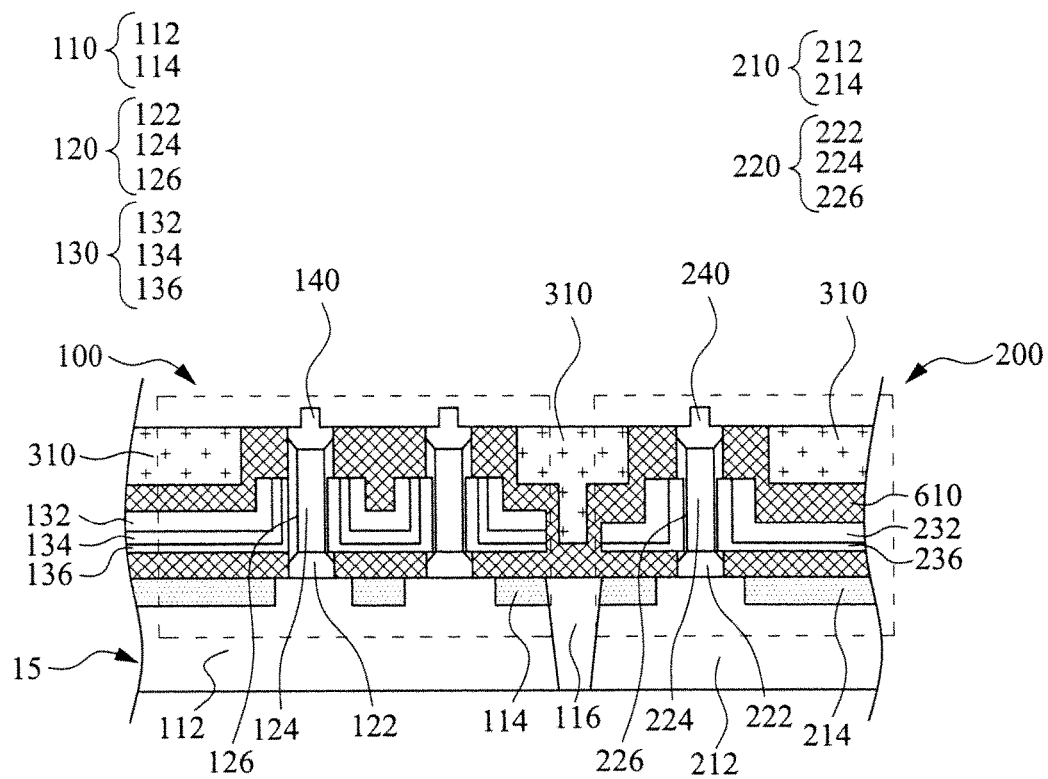
FIG. 3 is a schematic view of at least a portion of the substrate in an intermediate stage of the method of fabricating the integrated circuit according to various embodiments of the present disclosure.

FIG. 3 is a schematic view of at least a portion of the substrate in an intermediate stage of the method of fabricating the integrated circuit according to various embodiments of the present disclosure. Referring to FIG. 3, a substrate 15 is received. The substrate 15 has at least one n-type transistor 100 and at least one p-type transistor 200. The n-type transistor 100 and the p-type transistor 200 respectively comprises a source electrode disposed in the substrate, at least one semiconductor channel extending substantially perpendicular to the source electrode, a gate electrode surrounding the semiconductor channel, and a drain electrode disposed on top of the semiconductor channel. As shown in FIG. 3, the n-type transistor 100 includes a source electrode 110, at least one semiconductor channel 120, a gate electrode 130, and a drain electrode 140. The details of the source electrode 110, the semiconductor channel 120, the gate electrode 130, and the drain electrode 140 of the n-type transistor 100 are similar to those aforementioned, and therefore the details are omitted here. The p-type transistor 200 includes a source electrode 210, at least one semiconductor channel 220, a gate electrode 230, and a drain electrode 240. The details of the source electrode 210, the semiconductor channel 220, the gate electrode 230, and the drain electrode 240 of the p-type transistor 200 are also similar to those aforementioned, and therefore the details are omitted here. As illustrated in FIG. 3, a passivation film 610 such as silicon nitride and a dielectric film 310 such as silicon oxide could be conformally deposited to cover the n-type transistor 100 and the p-type transistor 200, and the passivation film 610 and the dielectric film 310 could be planarized by polishing and/or etched to expose respective drain electrodes 140, 240 of the n-type transistor 100 and the p-type transistor 200.

Figure 4:
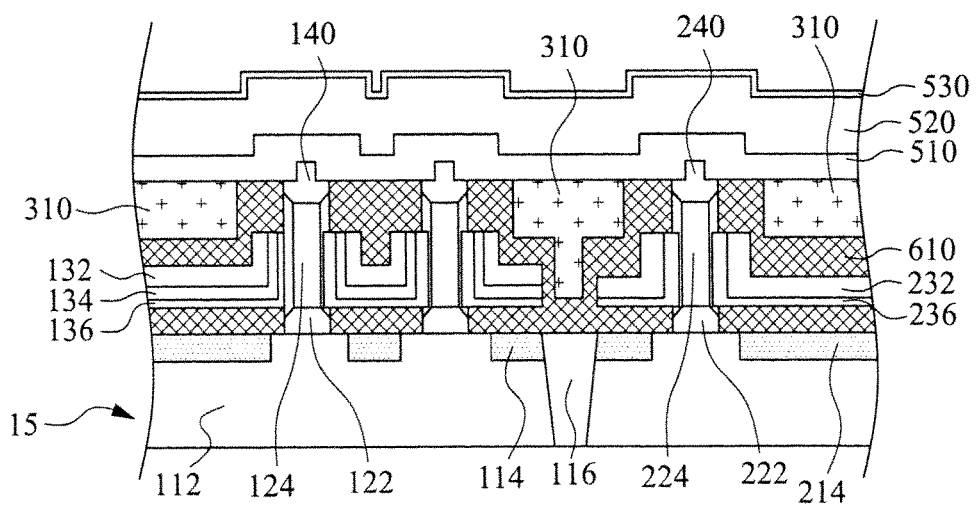
FIG. 4 is a schematic view of the substrate shown in FIG. 3 in a subsequent stage of the method of fabricating the integrated circuit according to various embodiments of the present disclosure.
Figure 5A:
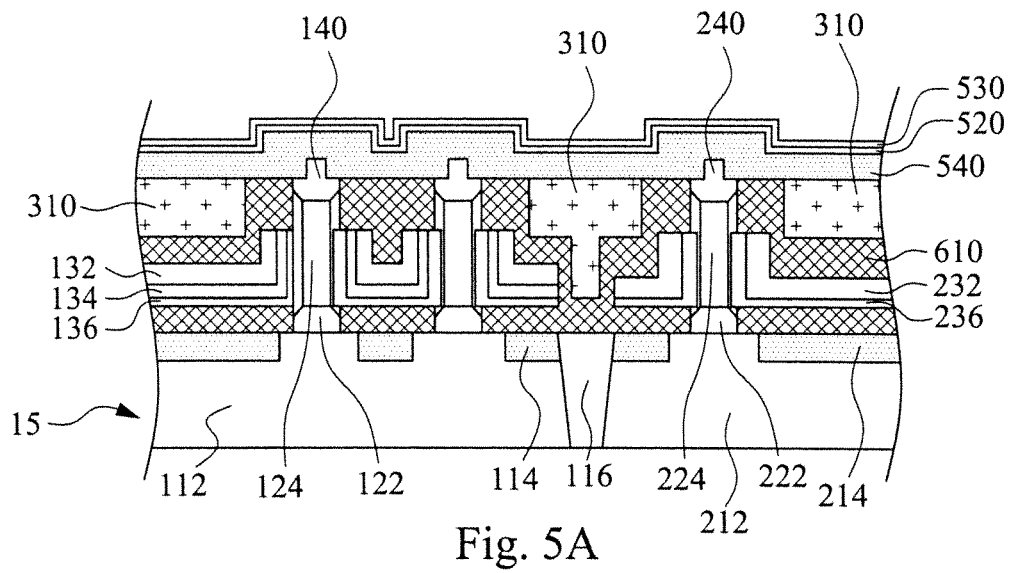
FIGS. 5A and 5B are schematic views of the substrate shown in FIG. 4 in a subsequent stage of the method of fabricating the integrated circuit according to various embodiments of the present disclosure.
Figure 5B:
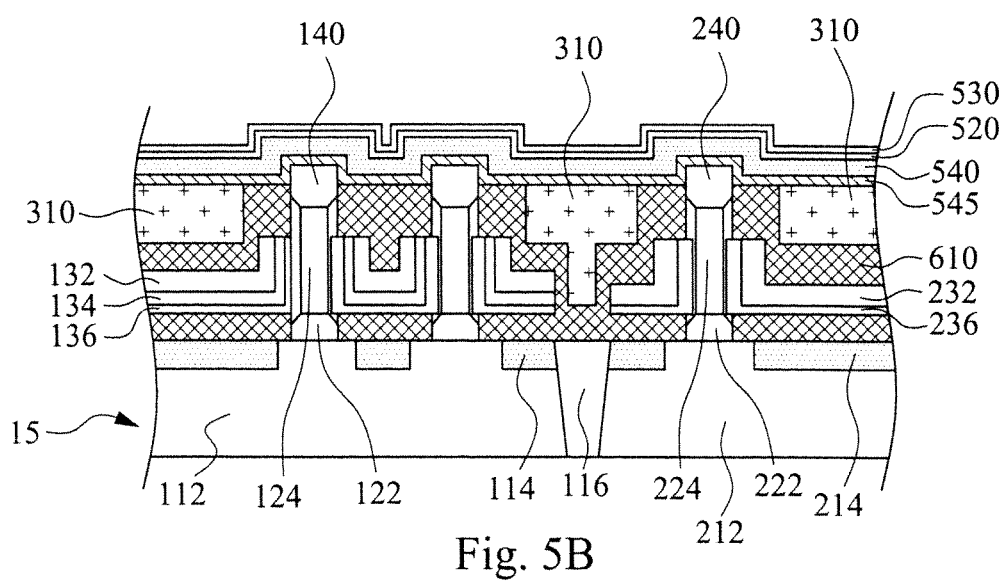

FIG. 4 is a schematic view of the substrate shown in FIG. 3 in a subsequent stage of the method of fabricating the integrated circuit according to various embodiments of the present disclosure. FIG. 5 is a schematic view of the substrate shown in FIG. 4 in a subsequent stage of the method of fabricating the integrated circuit according to various embodiments of the present disclosure. Referring to FIG. 4 and FIGS. 5A and 5B, after the operation of receiving the substrate 15 having at least one n-type transistor 100 and at least one p-type transistor 200, an implanted silicide layer 540 is formed. The silicide layer 540 covers the drain electrodes 140, 240 of the n-type transistor 100 and the p-type transistor 200. The implanted silicide layer 540 could be formed in directly depositing a silicide film such as titanium silicide (TiSi), nickel silicide (NiSi), cobalt silicide (CoSi), nickel platinum silicide (NiPtSi) to cover the drain electrode 140 of the n-type transistor 100 and the drain electrode 240 of the p-type transistor 200. The implanted silicide layer 540 could be formed by multiple steps. As illustrated in FIG. 5A or 5B, in various embodiments of the present disclosure, the operation forming the implanted silicide layer 540 covering the drain electrodes 140, 240 of the n-type transistor 100 and the p-type transistor 200 includes depositing an amorphous silicon (a-Si) layer 510 covering the drain electrodes 140, 240 of the n-type transistor 100 and the p-type transistor 200. Next, a first metal layer 520 is deposited to cover the amorphous silicon layer 510. The first metal layer 520 could include titanium (Ti), nickel (Ni), cobalt (Co), platinum (Pt) or a combination thereof. The amorphous silicon layer 510 and the first metal layer 520 are annealed to convert at least a portion of the amorphous silicon layer 510 into a silicide layer, which is then implanted and becomes the implanted silicide layer 540, as shown in FIG. 5A or 5B. A thermal treatment process such as rapid thermal annealing (RTA) could be performed for partially or entirely converting the amorphous silicon layer 510 into a silicide layer. Referring to FIG. 5A, all a-Si layer 510 is converted into the silicide layer, and then implanted by a dopant through, e.g., a drive-in annealing process, to be the implanted silicide layer 540. In various embodiments, the drive-in annealing process is conducted under a temperature of 400-600 C for 10-100 seconds. In some embodiments, the temperature is 500-550 C for 20-40 seconds. On the other hand, concerning the conversion of the a-Si layer 510 into the silicide layer may consume some of the drain electrode 140, 240 of the n-type transistor 100 and the p-type transistor 200, i.e., together converting the drain electrodes into silicide, which reduces the contact area and conductivity of the drain electrodes to the drain pad 150. Alternatively, referring to FIG. 5B, a portion of the a-Si layer 510, e.g., a bottom layer of the a-Si layer 510 covering the drain electrode 140 or 240, is left without being converted in view of the protection of the drain electrode in conversion. To provide the required conductivity that originally given by the silicide layer, the non-converted a-Si layer is also implanted with a dopant through a thermal treatment such as the drive-in annealing process. In some embodiments, the dopant is an IIIA- or VA-element such as B, P, or As. As a result, an implanted a-Si layer 545 covering the drain electrode 140 or 240 is formed in FIG. 5B. The implanted a-Si layer 545 may act as an extended drain electrode that significantly enlarge the contact area of the drain electrode to the drain pad, and provide an buffer zone preventing the drain electrodes 140, 240 from being consumed during the conversion of the a-Si layer into the silicide layer. Other elements can be added into the a-Si or silicide layer in favor of the conductivity of the drain pad 510. In various embodiments, the drive-in annealing process is conducted under a temperature of 400-600° C. for 10-100 seconds. In some embodiments, the temperature is 500-550° C. for 20-40 seconds. In various embodiments of the present disclosure, the first metal layer 520 is also converted to the implanted silicide layer 540. Also as illustrated in FIG. 5, after the implanted silicide layer 540 is formed, a capping layer 530 is formed. The capping layer 530 covers the implanted silicide layer 540. The capping layer 530 could include titanium nitride (TiN). In some embodiments, the capping layer 530 is formed on the first metal layer 520 before annealing the amorphous silicon layer 510.

Figure 6:
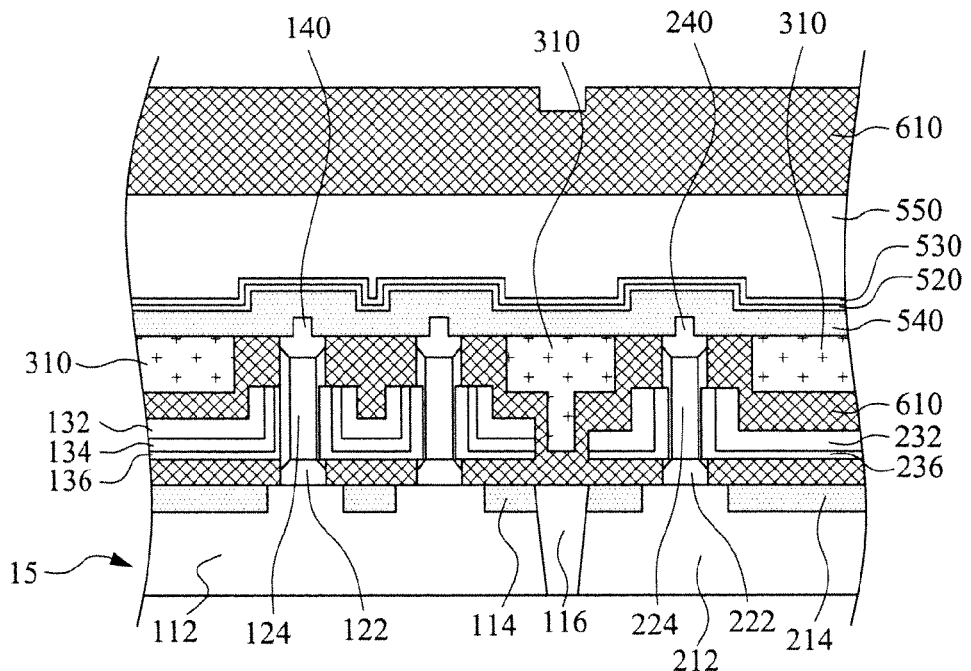
FIG. 6 is a schematic view of the substrate shown in FIG. 5 in a subsequent stage of the method of fabricating the integrated circuit according to various embodiments of the present disclosure.
Figure 7:
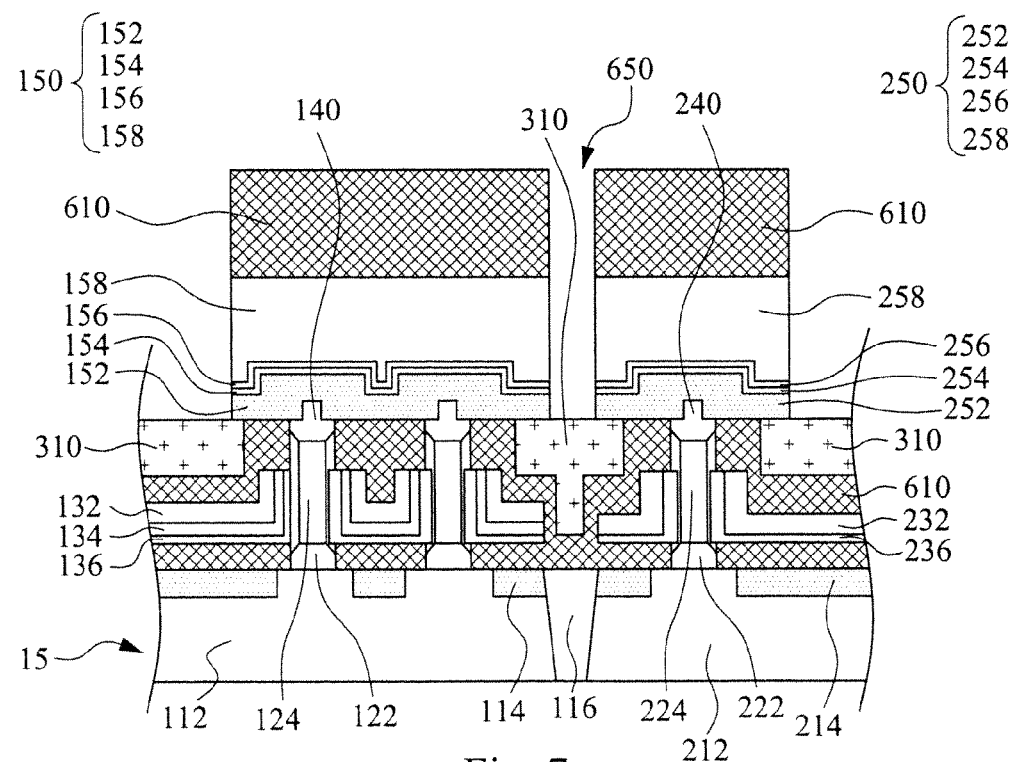
FIG. 7 is a schematic view of the substrate shown in FIG. 6 in a subsequent stage of the method of fabricating the integrated circuit according to various embodiments of the present disclosure.

FIG. 6 is a schematic view of the substrate shown in FIG. 5A in a subsequent stage of the method of fabricating the integrated circuit according to various embodiments of the present disclosure. FIG. 7 is a schematic view of the substrate shown in FIG. 6 in a subsequent stage of the method of fabricating the integrated circuit according to various embodiments of the present disclosure. Referring to FIG. 6, after the operation of forming the capping layer 530 covering the implanted silicide layer 540, a metal layer 550 is formed to cover the capping layer 530. The metal layer 550 could include tungsten (W). As illustrated in FIG. 6, after the operation of forming the metal layer 550 covering the capping layer 530, a first passivation layer 610 is formed. The first passivation layer 610 covers the metal layer 550. The first passivation layer 610 could include silicon nitride, and be formed in any suitable depositing processes, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD). Referring to FIG. 7, after the operation of forming the first passivation layer 610 covering the metal layer 550, a opening 650 through the implanted silicide layer 540, the capping layer 530, the metal layer 550, and the first passivation layer 610 is formed to yield respective drain pads 150, 250 disposed on the drain electrodes 140, 240 of the n-type transistor 100 and the p-type transistor 200. In other words, the implanted silicide layer 540, the capping layer 530, and the metal layer 550 formed in pervious operations are separated into drain pads 150, 250 respectively disposed on the drain electrodes 140, 240 of the n-type transistor 100 and the p-type transistor 200. The drain pads 150 of the n-type transistor 100 includes an implanted silicide layer 152, a capping layer 156, and a contact metal layer 158, and the drain pad 250 of the p-type transistor 200 includes an implanted silicide layer 252, a capping layer 256, and a contact metal layer 258. In various embodiments of the present disclosure, the drain pads 150 of the n-type transistor 100 further include a metal layer 154, and the drain pads 250 of the p-type transistor 200 further include a metal layer 254 as shown in FIG. 7.

Figure 8:
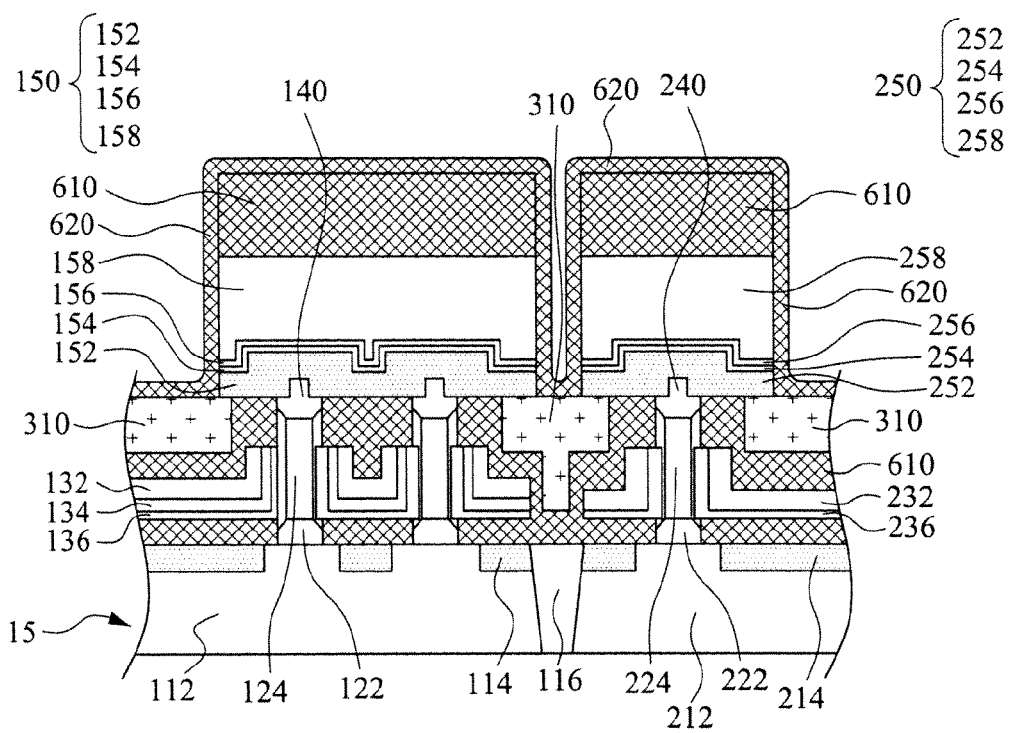
FIG. 8 is a schematic view of the substrate shown in FIG. 7 in a subsequent stage of the method of fabricating the integrated circuit according to various embodiments of the present disclosure.
Figure 9:
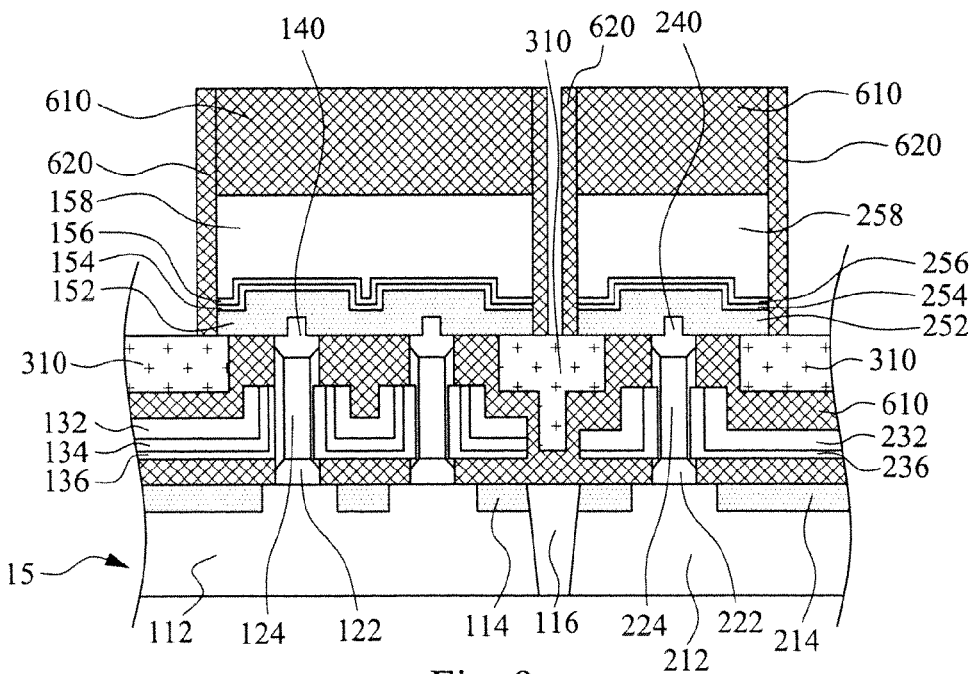
FIG. 9 is a schematic view of the substrate shown in FIG. 8 in a subsequent stage of the method of fabricating the integrated circuit according to various embodiments of the present disclosure.

FIG. 8 is a schematic view of the substrate shown in FIG. 7 in a subsequent stage of the method of fabricating the integrated circuit according to various embodiments of the present disclosure. FIG. 9 is a schematic view of the substrate shown in FIG. 8 in a subsequent stage of the method of fabricating the integrated circuit according to various embodiments of the present disclosure. Referring to FIG. 8, after the operation of forming the opening 650 through the implanted silicide layer 540, the capping layer 530, the metal layer 550, and the first passivation layer 610, a second passivation layer 620 is formed covering sidewalls of the drain pads 150, 250. The second passivation layer 620 could include silicon nitride as the first passivation layer 610, and be formed in any suitable depositing processes, including but not limited to, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), high temperature oxide deposition (HTO), low temperature oxide deposition (LTO), limited reaction processing CVD (LRPCVD). Therefore, the drain pad 150 of the n-type transistor 100 and the drain pad 250 of the p-type transistor 200 could be further protected, and the reliability of the n-type transistor 100 and the p-type transistor 200 could be further improved. Referring to FIG. 9, the second passivation layer 620 could be further etched to be planarized and part of the second passivation layer 620 is removed for following processes.

Figure 10:
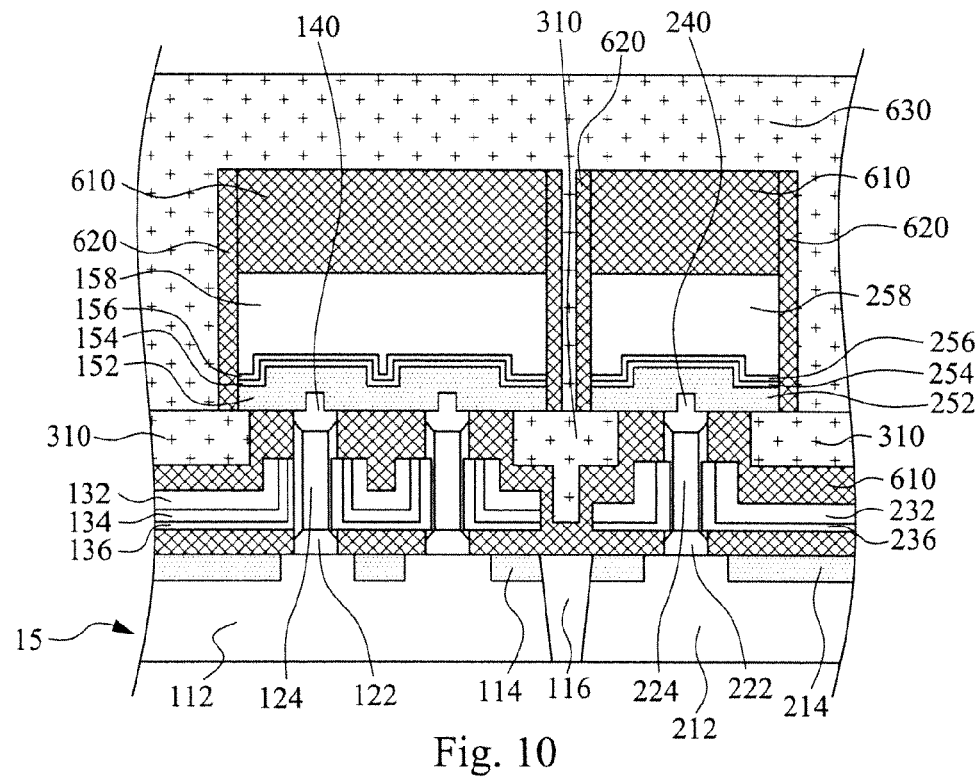
FIG. 10 is a schematic view of the substrate shown in FIG. 9 in a subsequent stage of the method of fabricating the integrated circuit according to various embodiments of the present disclosure.
Figure 11:
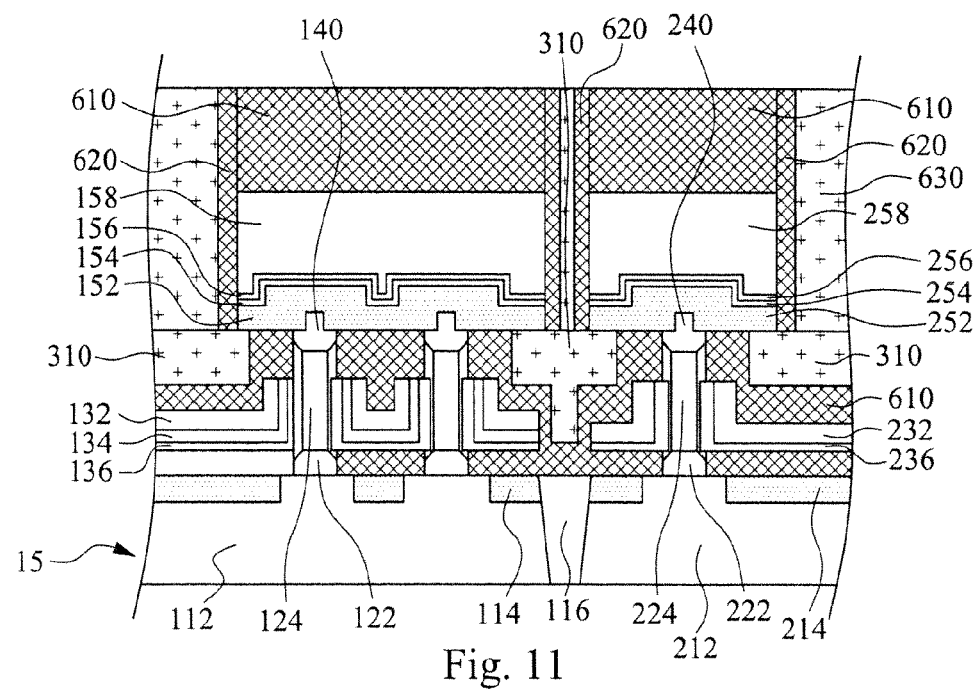
FIG. 11 is a schematic view of the substrate shown in FIG. 10 in a subsequent stage of the method of fabricating the integrated circuit according to various embodiments of the present disclosure.

FIG. 10 is a schematic view of the substrate shown in FIG. 9 in a subsequent stage of the method of fabricating the integrated circuit according to various embodiments of the present disclosure. FIG. 11 is a schematic view of the substrate shown in FIG. 10 in a subsequent stage of the method of fabricating the integrated circuit according to various embodiments of the present disclosure. Referring to FIG. 10, after the operation of forming the second passivation layer 620 covering sidewalls of the drain pads 150, 250, an first oxide layer 630 is formed to fulfill gaps between the sidewalls of the drain pads 150, 250. The first oxide layer 630 could include silicon oxide and be formed in any suitable depositing processes. In various embodiments of the present disclosure, the forming the first oxide layer 630 to fulfill gaps between the sidewalls of the drain pads 150, 250 is performed by flowable CVD. Therefore, gaps between the sidewalls of the drain pads 150, 250 could be fulfilled without voids, and the reliability of the n-type transistor 100 and the p-type transistor 200 could be further improved. Referring to FIG. 11, after the operation of forming the first oxide layer 630, the first oxide layer 630 is polished. It should be noticed that the polishing stops at the first passivation layer 610 because the first passivation layer 610 includes silicon nitride which is different from the first oxide layer 630. Therefore, process window of the polishing is increased, and the uniformity of thickness of the drain pads 150, 250 could be improved.

Figure 12:
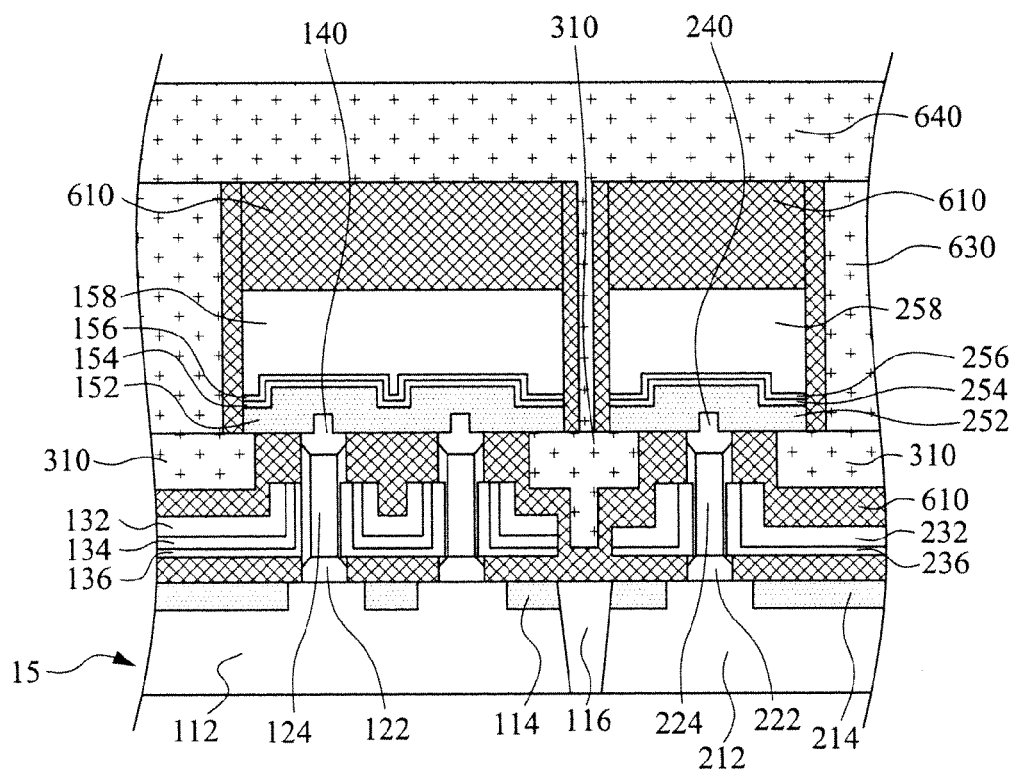
FIG. 12 is a schematic view of the substrate shown in FIG. 11 in a subsequent stage of the method of fabricating the integrated circuit according to various embodiments of the present disclosure.
Figure 13:
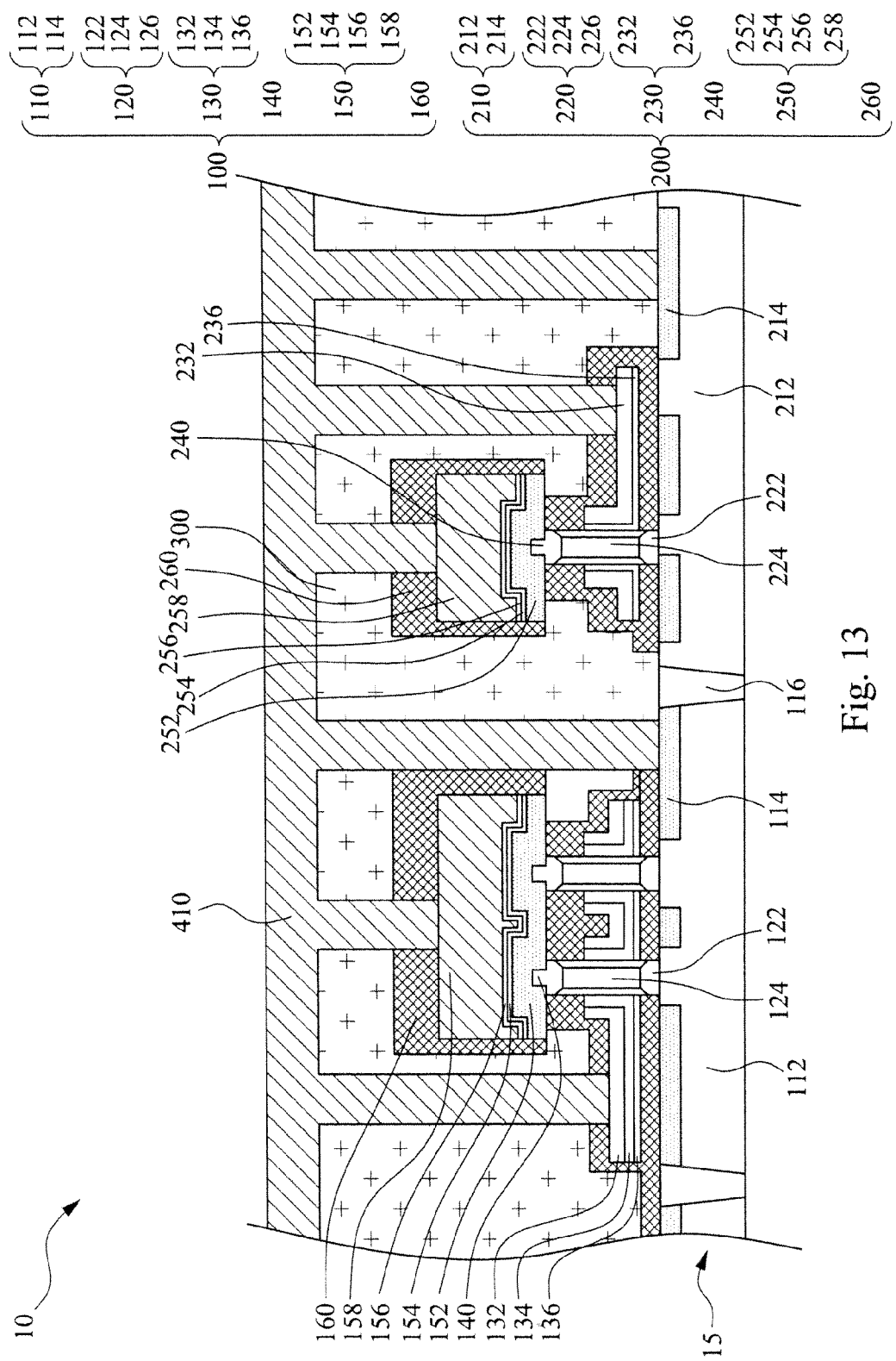
FIG. 13 is a schematic view of the substrate shown in FIG. 12 in a subsequent stage of the method of fabricating the integrated circuit according to other various embodiments of the present disclosure.

FIG. 12 is a schematic view of the substrate shown in FIG. 11 in a subsequent stage of the method of fabricating the integrated circuit according to various embodiments of the present disclosure. FIG. 13 is a schematic view of the substrate shown in FIG. 12 in a subsequent stage of the method of fabricating the integrated circuit according to other various embodiments of the present disclosure. Referring to FIG. 12, after the operation of polishing the first oxide layer 630, an inter-layer dielectric 640 is formed. The inter-layer dielectric 640 covers the n-type transistor 100, the p-type transistor 200, and the substrate 15. The inter-layer dielectric (ILD) layer 640 could include any now known or later developed dielectric appropriate for a first contact layer such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phoso-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer materials, other low dielectric constant material, or layers thereof. In various embodiments of the present disclosure, the ILD layer 230 could include high dielectric (high-k) dielectrics such as metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$). After the operation of forming the inter-layer dielectric 640, a plurality of contact metals 400 is formed. Referring to FIG. 13, a plurality of openings could be formed by litho-etching processes to expose the source electrodes 110, 210, the gate electrodes 130, 230, and the drains pad 150, 250 of the n-type transistor 100 and the p-type transistor 200. Then a contact metal film 410 could be formed on the inter-layer dielectric 300 (including the first oxide layer 630 and the an inter-layer dielectric 640) as illustrated in FIG. 13. As illustrated in FIG. 13, the contact metal film 410 is disposed in the inter-layer dielectric 300, and the contact metals 400 are respectively in direct contact with the source electrodes 110, 210, the gate electrodes 130, 230, and the drains pad 150, 250 of the n-type transistor 100 and the p-type transistor 200. The contact metal film 410 is polished to yield the plurality of contact metals 400 as illustrated in FIG. 1. Therefore, the integrated circuit 10 illustrated in FIG. 1 according to various embodiments of the present disclosure is fabricated. The plurality of contact metals 400 could also include tungsten, aluminum, copper, or other suitable materials.

Figure 14:
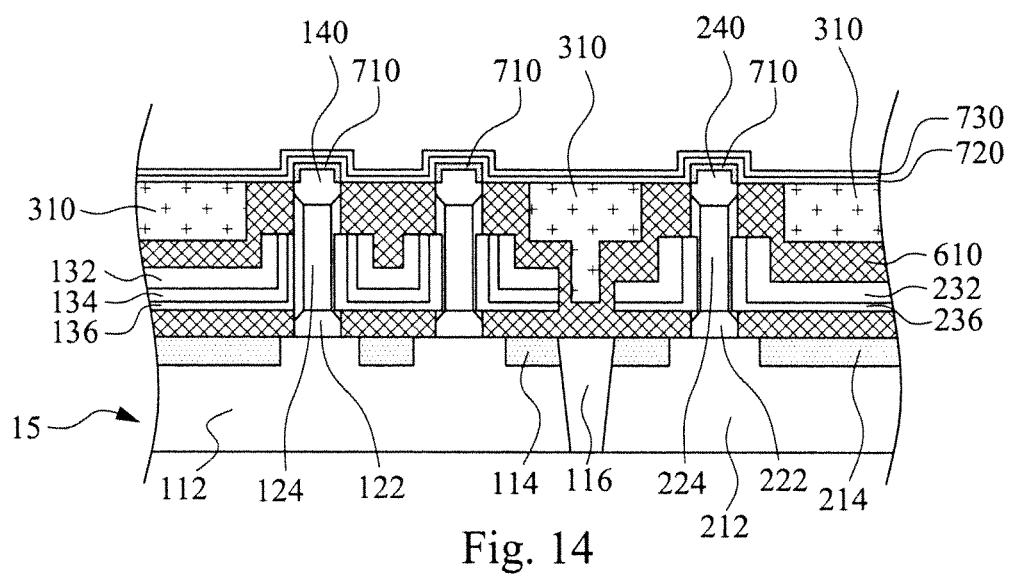
FIG. 14 is a schematic view of the substrate shown in FIG. 3 in a subsequent stage of the method of fabricating the integrated circuit according to other various embodiments of the present disclosure.

FIG. 14 shows forming a capping layer and an implanted silicide layer covering the drain electrodes of the n-type transistor and the p-type transistor as shown in block 804 of the method 800 according to various embodiments. FIG. 14 is a schematic view of the substrate shown in FIG. 3 in a subsequent stage of the method of fabricating the integrated circuit according to various embodiments of the present disclosure. Referring to FIG. 14, after the operation of receiving the substrate 15 having at least one n-type transistor 100 and at least one p-type transistor 200, an implanted silicide layer 710 and a capping layer 730 are formed. The implanted silicide layer 710 covers the drain electrodes 140, 240 of the n-type transistor 100 and the p-type transistor 200. The implanted silicide layer 710 could include titanium silicide (TiSi), nickel silicide (NiSi), cobalt silicide (CoSi), nickel platinum silicide (NiPtSi) or a combination thereof to cover the drain electrode 140 of the n-type transistor 100 and the drain electrode 240 of the p-type transistor 200. The implanted silicide layer 710 could be formed by multiple steps. As illustrated in FIG. 14, in various embodiments of the present disclosure, the operation forming the capping layer 730 and the implanted silicide layer 710 covering the drain electrodes 140, 240 of the n-type transistor 100 and the p-type transistor 200 includes depositing a first metal layer 720 covering the drain electrodes 140, 240 of the n-type transistor 100 and the p-type transistor 200. The first metal layer 720 could include titanium (Ti), nickel (Ni), cobalt (Co), platinum (Pt) or a combination thereof. Next, the drain electrodes 140, 240 of the n-type transistor 100 and the p-type transistor 200 and the first metal layer 720 are annealed to convert part of the drain electrodes 140, 240 to the implanted silicide layer 710 as shown in FIG. 14. The volume of the drain electrodes 140, 240 are thus decreased, after the implanted silicide layers 710 are formed. The annealing process such as rapid thermal annealing (RTA) could be performed for forming the implanted silicide layer 710. Then the capping layer 730 is formed on the first metal layer 720. The capping layer 730 covers the first metal layer 720. The capping layer 730 could include titanium nitride (TiN), tantalum nitride (TaN), or a combination thereof. In some embodiments, the capping layer 730 may be formed before the annealing process. For example, the operation forming the capping layer 730 and the implanted silicide layer 710 covering the drain electrodes 140, 240 of the n-type transistor 100 and the p-type transistor 200 may include depositing a first metal layer 720 covering the drain electrodes 140, 240 of the n-type transistor 100 and the p-type transistor 200. Next, a capping layer 730 is formed on the first metal layer 720. Then the drain electrodes 140, 240 of the n-type transistor 100 and the p-type transistor 200 and the first metal layer 720 are annealed to convert part of the drain electrodes 140, 240 to the implanted silicide layer 710 as shown in FIG. 14.

Figure 15:
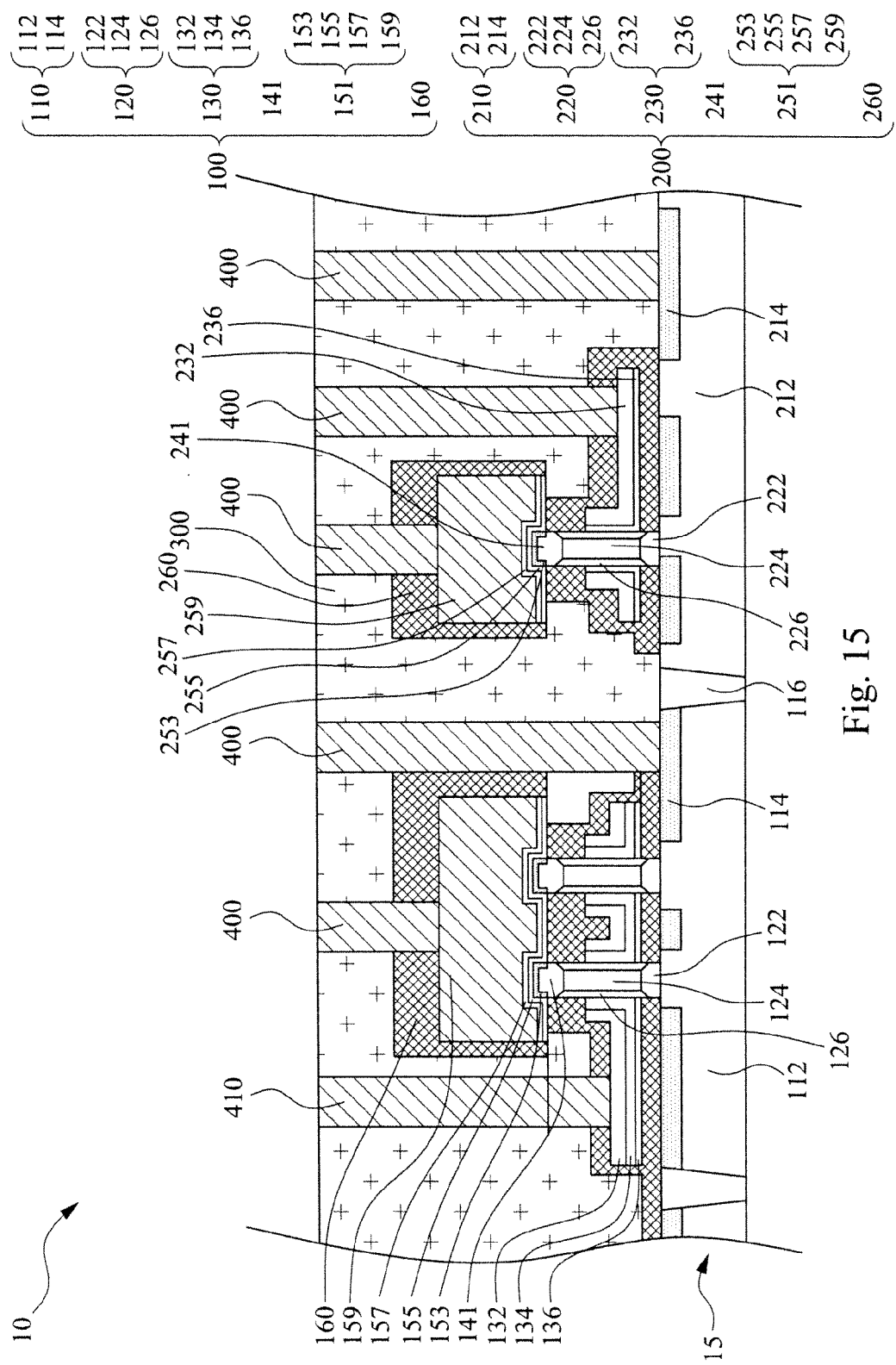
FIG. 15 is a schematic view of at least a portion of an integrated circuit according to various embodiments of the present disclosure.

FIG. 15 is a schematic view of at least a portion of an integrated circuit according to various embodiments of the present disclosure. Referring to FIGS. 1,2 and 15, the substrate shown in FIG. 15 is the substrate shown in FIG. 14 after operating the method 800 from block 808 to block 822. The differences between the integrated circuit 10 in FIG. 15 and FIG. 1 include a drain electrode 141 of the n-type transistor 100, a drain pad 151 of the n-type transistor 100, a drain electrode 241 of the p-type transistor 200, and a drain pad 251 the p-type transistor 200. The drain pad 151 of the n-type transistor 100 includes an implanted silicide layer 153, a metal layer 155, a capping layer 157, and a contact metal layer 159. The implanted silicide layer 153 is in direct contact with the drain electrode 141 or an implanted a-Si layer (not shown) may be sandwiched by the implanted silicide layers 153, 253 and the drain electrodes 141, 241. The metal layer 155 is disposed on the implanted silicide layer 153. The capping layer 157 is disposed on the implanted silicide layer 153. The contact metal layer 159 is disposed on the capping layer 157. The drain pad 251 of the p-type transistor 200 includes an implanted silicide layer 253, a metal layer 255, a capping layer 257, and a contact metal layer 259. The implanted silicide layer 253 is in direct contact with the drain electrode 241. The metal layer 255 is disposed on the implanted silicide layer 253. The capping layer 257 is disposed on the silicide layer 253. The contact metal layer 259 is disposed on the capping layer 257. In various embodiments of the present disclosure, the implanted silicide layers 153, 253 include titanium silicide (TiSi), nickel silicide (NiSi), cobalt silicide (CoSi), nickel platinum silicide (NiPtSi) or a combination thereof. In various embodiments of the present disclosure, the metal layers 155, 255 include titanium (Ti), nickel (Ni), cobalt (Co), platinum (Pt) or a combination thereof. In various embodiments of the present disclosure, the capping layers 157, 257 include titanium nitride (TiN), tantalum nitride (TaN), or a combination thereof. In various embodiments of the present disclosure, the contact metal layers 159, 259 include tungsten (W), aluminum (Al), cobalt (Co), or a combination thereof.

According to other various embodiments of the present disclosure, resistances of the integrated circuits with the transistors such as drain side contact resistivity and interconnect sheet resistance are reduced because of the design of the drain pad with the implanted silicide layer. The drain pad of the transistors includes the implanted silicide layer as the entire drain pad or one of the multiple conductive layers in the drain pad. The multiple conductive layers may include an implanted amorphous silicon layer that is not covered into the silicide layer, and is in direct contact with the drain electrode. Therefore, drain side contact resistivity and interconnect sheet resistance correlated to the transistors could be significantly reduced by introducing the contact metal layer which has lower resistance than that of the silicide layer or extended contact area between the drain pad and the drain electrode. In addition, process flexibility in fabricating the integrated circuits with the transistors such as control of drain consumption and silicidation during fabricating the transistors is also improved by the introduction of the non-converted buffer layer, i.e., the implanted a-Si layer between the implanted silicide layer and the drain electrode, and therefore performance of the integrated circuits with the transistors according to various embodiments of the present disclosure is enhanced.

According to other various embodiments of the present disclosure, the transistor includes a source electrode, at least one semiconductor channel, a gate electrode, a drain electrode, and a drain pad. The source electrode is disposed in a substrate. The semiconductor channel extends substantially perpendicular to the source electrode. The gate electrode surrounds the semiconductor channel. The drain electrode is disposed on top of the semiconductor channel. The improved drain pad is disposed on the drain electrode, wherein the drain pad comprises multiple conductive layers in which an implanted a-Si layer is included.

According to other various embodiments of the present disclosure, the integrated circuit includes at least one n-type transistor, at least one p-type transistor, an inter-layer dielectric, and a plurality of contact metals. The n-type transistor is disposed on a substrate. The p-type transistor is disposed on the substrate and is adjacent to the n-type transistor. The n-type transistor and the p-type transistor respectively includes a source electrode disposed in the substrate, at least one semiconductor channel extending substantially perpendicular to the source electrode, a gate electrode surrounding the semiconductor channel, a drain electrode disposed on top of the semiconductor channel, and a drain pad disposed on the drain electrode. The drain pad includes multiple conductive layers. The inter-layer dielectric covers the n-type transistor, the p-type transistor, and the substrate. The plurality of contact metals is disposed in the inter-layer dielectric, and the contact metals are respectively in direct contact with the source electrodes, the gate electrodes, and the drains pad of the n-type transistor and the p-type transistor.

According to various embodiments of the present disclosure, a method of fabricating the integrated circuit includes receiving a substrate having at least one n-type transistor and at least one p-type transistor, wherein each of the n-type transistor and the p-type transistor comprises a source electrode disposed in the substrate, at least one semiconductor channel extending substantially perpendicular to the source electrode, a gate electrode surrounding the semiconductor channel, and a drain electrode disposed on top of the semiconductor channel. The method further includes forming a capping layer and an implanted silicide layer covering the drain electrodes of the n-type transistor and the p-type transistor, wherein the capping layer is formed on the implanted silicide layer. The implanted silicide layer is formed by implanting a silicide layer that is formed first from an a-Si layer. In some embodiments, all or a part of the a-Si layer is converted into the silicide layer. The implantation is then conducted by a thermal treatment such as a drive-in annealing process under a low temperature. The method further includes forming a metal layer covering the capping layer. The method further includes forming a first passivation layer covering the metal layer. The method further includes forming a opening through the implanted silicide layer, the capping layer, the metal layer, and the first passivation layer to yield respective drain pads disposed on the drain electrodes of the n-type transistor and the p-type transistor. The method further includes forming a second passivation layer covering sidewalls of the drain pads. The method further includes forming a first oxide layer to fulfill gaps between the sidewalls of the drain pads and cover the first passivation layer. The method further includes polishing the first oxide layer, wherein the polishing stops at the first passivation layer. The method further includes forming an inter-layer dielectric covering the n-type transistor, the p-type transistor, and the substrate. The method further includes forming a plurality of contact metals disposed in the inter-layer dielectric, and the contact metals being respectively in direct contact with the source electrodes, the gate electrodes, and the drains pad of the n-type transistor and the p-type transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
   a source electrode disposed in a substrate;
   at least one semiconductor channel extending substantially perpendicular to the source electrode;
   a gate electrode surrounding the semiconductor channel;
   a drain electrode disposed on top of the semiconductor channel;
   a passivation film surrounding the gate electrode and the drain electrode; and a drain pad disposed on the drain electrode, wherein the drain electrode has a top portion protruding from the passivation film, and the drain pad comprises an implanted silicide layer in direct contact with a top and a sidewall of the top portion of the drain electrode.

2. The transistor of claim 1, wherein the drain pad further comprises:
a capping layer disposed on the implanted silicide layer; and
a contact metal layer disposed on the capping layer.

3. The transistor of claim 2, wherein the implanted silicide layer comprises titanium silicide, nickel silicide, cobalt silicide, nickel platinum silicide or a combination thereof.

4. The transistor of claim 2, wherein the drain pad further comprises a metal layer disposed between the implanted silicide layer and the capping layer.

5. The transistor of claim 1, wherein the implanted silicide layer comprises a dopant of boron (B), aresenic (As), or phosphorous (P).

6. An integrated circuit, comprising:
at least one n-type transistor disposed on a substrate;
at least one p-type transistor disposed on the substrate and adjacent to the n-type transistor, wherein the n-type transistor and the p-type transistor respectively comprises:
a source electrode disposed in the substrate;
at least one semiconductor channel extending substantially perpendicular to the source electrode;
a gate electrode surrounding the semiconductor channel;
a drain electrode disposed on top of the semiconductor channel; and
a drain pad disposed on the drain electrode, wherein the drain pad comprises multiple conductive layers having an implanted silicide layer comprising a dopant and a contact metal layer disposed on the implanted silicide layer, and the contact metal layer has a resistance lower than a resistance of the implanted silicide layer;
an inter-layer dielectric covering the n-type transistor, the p-type transistor, and the substrate; and
a plurality of contact metals disposed in the inter-layer dielectric, and the contact metals being respectively in direct contact with the source electrodes, the gate electrodes, and the drains pad of the n-type transistor and the p-type transistor.

7. The integrated circuit of claim 6, wherein the multiple conductive layers further comprises:
an implanted silicon layer in direct contact with the drain electrode; and
a capping layer disposed on the implanted silicide layer.

8. The integrated circuit of claim 7, wherein the implanted silicide layer comprises titanium silicide, nickel silicide, cobalt silicide, nickel platinum silicide or a combination thereof.

9. The integrated circuit of claim 7, wherein the capping layer comprises titanium nitride (TiN), tantalum nitride (TaN), or a combination thereof.

10. The integrated circuit of claim 7, wherein the implanted silicide layer is implanted by the dopant of boron (B), phosphorous (P) or arsenic (As).

11. The integrated circuit of claim 8, wherein each of the n-type transistor and the p-type transistor further comprises:
a passivation layer encapsulating the drain pad.

12. The integrated circuit of claim 9, wherein the multiple conductive layer further comprises a metal layer disposed between the implanted silicide layer and the capping layer.

13. The integrated circuit of claim 8, wherein the metal layer comprises titanium (Ti), nickel (Ni), cobalt (Co), platinum (Pt) or a combination thereof.

14. The transistor of claim 1, further comprising a passivation film surrounding the drain electrode.

15. The transistor of claim 14, wherein the implanted silicide layer is further disposed on the passivation film.

16. A transistor, comprising:
a source electrode disposed in a substrate;
at least one semiconductor channel extending substantially perpendicular to the source electrode;
a gate electrode surrounding the semiconductor channel;
a drain electrode disposed on top of the semiconductor channel; and
a drain pad disposed on the drain electrode, wherein the drain pad comprises an implanted silicide layer and an implanted amorphous silicon layer sandwiched between the implanted silicide layer and the drain electrode.

17. The transistor of claim 16, further comprising a passivation film surrounding the drain electrode.

18. The transistor of claim 16, wherein the implanted amorphous silicon layer is further disposed on the passivation film.

19. The transistor of claim 16, wherein the implanted amorphous silicon layer is implanted by a dopant of boron (B), phosphorous (P) or arsenic (As).

20. The transistor of claim 16, wherein the implanted amorphous silicon layer surrounds a sidewall of the drain electrode.

* * * * *